United States Patent
Griswold et al.

(10) Patent No.: US 8,224,609 B2
(45) Date of Patent: Jul. 17, 2012

(54) EXCITATION UNIFORMITY

(76) Inventors: Mark A. Griswold, Shaker Heights, OH (US); Jeremiah Heilman, University Heights, OH (US)

( * ) Notice: Subject to any disclaimer, the term of this patent is extended or adjusted under 35 U.S.C. 154(b) by 616 days.

(21) Appl. No.: 12/407,889

(22) Filed: Mar. 20, 2009

(65) Prior Publication Data
US 2010/0241389 A1    Sep. 23, 2010

(51) Int. Cl.
*G01R 35/00*    (2006.01)
(52) U.S. Cl. .............. 702/106; 702/32; 702/86; 702/94
(58) Field of Classification Search ............. 702/32, 702/86, 94, 106; 700/56, 67, 73, 90; 324/200, 324/262
See application file for complete search history.

(56) References Cited

U.S. PATENT DOCUMENTS

| | | | |
|---|---|---|---|
| 6,704,594 B1 * | 3/2004 | Blank et al. | 600/423 |
| 6,975,114 B1 * | 12/2005 | Ledden | 324/314 |
| 7,800,368 B2 * | 9/2010 | Vaughan et al. | 324/318 |

* cited by examiner

*Primary Examiner* — Mohamed Charioui
*Assistant Examiner* — Elias Desta
(74) *Attorney, Agent, or Firm* — John T. Kalnay

(57) ABSTRACT

Systems, methods, and other embodiments associated with MRI excitation are described. One example method includes performing a calibration to determine a set of transmission parameters for a set of excitation pulses for transmission channels available on a multi-channel MRI transmitter. The set of excitation pulses are configured to produce a resulting nuclear magnetic resonance (NMR) signal from an object exposed to the set of excitation pulses. The resulting NMR signal comprises NMR signal associated with a first NMR resonance associated with the object and NMR signal associated with a second NMR resonance associated with the object.

25 Claims, 6 Drawing Sheets

EXCITATION UNIFORMITY

BACKGROUND

Obtaining uniform saturation of either fat or water using spectrally selective pulses for excitation has be a consistent challenge in clinical magnetic resonance imaging (MRI). Obtaining uniform excitation has also been a consistent challenge. Spectrally selective pulses may excite spins of a particular frequency that is defined by the chemical environment. Spectrally selective pulses used for saturation of a particular chemical species typically excite these spins to around 90 degrees and then spoil this magnetization so that the magnetization does not contribute signal in a subsequent imaging experiment. Other spectrally selective pulses may only excite one particular chemical species for analysis as well.

Chemical shift refers to a variation in the resonance frequency of a nuclear spin due to the chemical environment in the region of the nucleus. The chemical environment in different molecules causes the electron density around the nuclei in a molecule to vary according to the types of nuclei and bonds in the molecule. The chemical shift of a nucleus is the difference between the resonance frequency of the nucleus and a standard, relative to the standard. The chemical shift may be very small and may be reported in ppm. The quantity is given the symbol delta, (d) and is characterized by the following equation:

$$d = (n - n_{REF}) \times 10^6 / n_{REF}$$

The electrons of an atom located in an applied magnetic field circulate about the direction of the applied magnetic field. The circulation of the electrons produces a small magnetic field at the nucleus. The small magnetic field opposes the applied field. Therefore, the magnetic field at the nucleus (B) may be smaller than the applied magnetic field (B0). The difference may be measured by a fraction s.

$$B = B_o(1-s)$$

Hydrogen in the human body may reside in molecules of fat (—$CH_2$— and/or —$CH_3$—) molecules of water ($H_2O$), and other molecules. The resonance frequency difference between the nuclear magnetic resonance (NMR) signal from these two types of hydrogens is approximately 220 Hz on a 1.5 Tesla imager. The chemical shift difference between these two types of hydrogens is approximately 3.5 ppm. While small, this difference can be exploited in MRI.

MRI chemical shift selective imaging refers to imaging a first set of spins in a volume that have a first chemical shift while excluding from the image other second chemical species that have a different, second chemical shift. Thus, chemical shift selective imaging produces an image from just one chemical shift component in a sample. If the sample being imaged is composed of hydrogens in molecules of water and fat, which are known to have different chemical shifts, then a chemical shift selective imaging technique could acquire an image of either the fat or the water in the object. However, variations in the B0 field may allow some signal from water spins to contaminate a fat spin image or vice versa.

Chemical shift selective imaging may be performed using a saturation method. In the saturation method a frequency selective saturation pulse is applied before the standard imaging pulses of a sequence. The saturation pulse is intended to zero out the magnetization from the component to be suppressed. When the standard imaging sequence follows it is not supposed to detect signal from the suppressed component. However, a consistent challenge in clinical MRI has been obtaining uniform saturation of a component to be suppressed using spectrally selective pulses.

Spectrally selective pulses may be employed to excite only the hydrogen atoms in fat molecules. The spectrally selective pulses are designed not to affect hydrogen atoms in other molecules (e.g., water). Therefore, the water molecules should contribute to a final image while the fat molecules should not. Images acquired in association with these spectrally selective pulses are referred to as "fat suppressed" or "fat saturated" images. These images may also be described as having a "saturation region" or "saturation band." Fat suppressed images are clinically important where a physician needs to "see through" the fat to see underlying items. If the image could not see through the fat, then fat could obstruct underlying pathology, and so on. While spectrally selective pulses that produce fat suppressed images are described, one skilled in the art will appreciate that example systems and methods may apply to other spectrally selective pulses and other chemical shifts.

Spectrally selective pulses may be compromised by variations in the main magnetic field (B0). While a significant amount of B0 inhomogeneity can be dealt with through shimming, variations introduced by, for example, magnetic susceptibilities in a patient may limit the ability to correct for inhomogeneity through shimming.

The magnitude of the chemical shift may be measured in parts per million. A fat saturation pulse may have a narrow bandwidth to facilitate exciting only fat spins. However, inhomogeneities on the order of a few parts per million across a patient after shimming may result in "spectral broadening". Spectral broadening may result in some fat spins lying outside the bandwidth of the saturation pulse. Spectral broadening disrupts the ability to effectively and uniformly perform saturation excitations throughout an entire sample. Since the entire sample cannot be saturated, some spins that were not supposed to contribute signal to an image may end up contributing signal to the image.

Some conventional attempts to address spectral broadening have focused on shimming. The conventional attempts may have included shimming hardware and software. Since shimming improvements have been sought for years, reductions in spectral broadening through improved shimming may only provide incremental or inconsequential results. Dynamic shimming, where shims may be tailored slice-by-slice, may provide additional improvements in the future.

Other conventional attempts to address spectral broadening have included performing multiple acquisitions at different echo times and then performing offline reconstruction to separate different spectral components. Performing multiple acquisitions may unacceptably lengthen acquisition time.

Still other conventional attempts to address spectral broadening have included using multi-dimensional pulses that utilize gradients during excitation to address frequency differences in space. However, the improvements sought by multi-dimensional pulses may be limited by gradient performance. To the extent that improvements are possible, the improvements may require optimization routines. While improvements may be available, multi-dimensional pulses may unacceptably lengthen acquisition time. Additionally, multi-dimensional pulses may impact specific absorption rate (SAR).

While chemical shifts and fat saturation have been described above, other challenges with uniformity have been faced over the years in MRI. For example, uniform excitation in a region, and uniform selective excitation in a region have been a challenge. Additionally, uniform selective excitation in a first region with simultaneous signal cancelling from a neighboring region has been a challenge.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
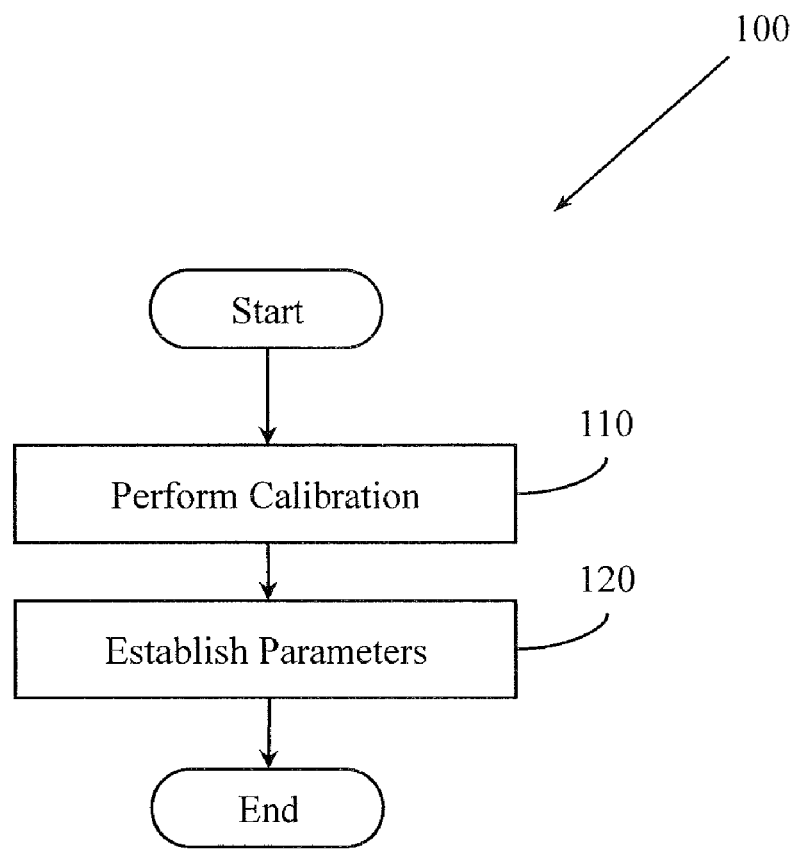
FIG. 1 illustrates an example method associated with calibrating and controlling a multi-channel transmission coil with individually programmable channels.

Example systems and methods improve excitation precision in MRI. In one embodiment, example systems and methods improve uniformity in saturation (e.g., fat saturation). In another embodiment, example systems and methods improve uniformity in excitation. In yet another embodiment, example systems and methods improve uniformity in regional excitation. Example systems and methods use an array of transmission coils to produce a radio frequency (RF) field that is more appropriate for saturation or precise excitation than is possible with a single channel transmitter. The center frequency for individual transmission coils may be tuned to its own local field and thus to its own local frequency. The center frequency for an individual transmission coil can be calibrated. The amplitude for an individual transmission coil can also be calibrated. Calibrating an individual transmission coil may include, for example, having the individual transmission coil perform a free induction decay (FID) experiment, a stimulated echo experiment, a spin echo experiment, and so on. The signal generated during the experiment may be received by a receive coil(s) and then spectrally analyzed in a clinically relevant and acceptable time frame. Spectrally analyzing the signal received in response to the experiment facilitates determining a desired bandwidth for an excitation pulse. With individual excitation pulses designed for individual channels on the multi-channel transmitter, improved excitation can be achieved by playing the individual excitation pulses on the different channels on the multi-channel transmitter. In one example, the individual narrow pulses from the individual channels sum together to cover the broad spectrum of the component to be suppressed in the sample. This yields improved uniform excitation over conventional single channel systems.

In one example, a B0 map and coil sensitivity profiles may be available. In this example, a least squares fit process or other minimization process may serially or simultaneously discover appropriate channel frequencies and amplitudes to facilitate producing conditions under which a preponderance of spins to be suppressed or excited experience a desired effect. In one example associated with saturation the effect may be to experience a desired tip angle (e.g., 90 degrees) that produces more optimal saturation.

In one example, an array may be available for signal reception. In this example, signals from different receive coils may be combined. The receive coils may have spatial uniqueness different from the transmission array. This spatial uniqueness facilitates weighting a resulting frequency estimate towards a particular location in the sample in which selective suppression is sought. The weighting facilitates further localization and greater optimization. The weighting also facilitates producing a B0 map or producing coil sensitivities without measuring the B0 field or coil sensitivities. This may save time over conventional systems where measurements are taken.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a method 100 associated with calibrating individual transmission channels in a multi-channel MRI transmitter. Method 100 may include, at 110, performing a calibration. The calibration is configured to determine a set of transmission parameters for a set of excitation pulses for two or more transmission channels available on the multi-channel transmitter associated with the magnetic resonance imaging (MRI) apparatus. The set of excitation pulses are configured to influence a resulting nuclear magnetic resonance (NMR) signal from an object exposed to the set of excitation pulses and to other imaging related pulses. As a result of chemical shift and/or contributions from different regions, the resulting NMR signal may have NMR signal associated with a first NMR resonance associated with the object and NMR signal associated with a second NMR resonance associated with the object.

In one example, performing the calibration at 110 includes controlling the multi-channel transmitter to apply radio frequency (RF) energy to the object according to one or more of, a free induction decay (FID) calibration, a stimulated echo calibration, and a spin echo calibration. Different calibrations may be useful for different calibration goals.

Method 100 may also include, at 120, establishing the transmission parameters in an MRI apparatus, in an MRI simulation, and so on. The transmission parameters may include, for example, transmission frequency, transmission amplitude, transmission bandwidth, and so on. In one embodiment, the first NMR resonance is associated with a first set of spins in the object and the second NMR resonance is associated with a second set of spins in the object. In one example, the first set of spins may be water spins and the second set of spins may be fat spins. In another example, the first set of spins may be located in a first region in the object and the second set of spins may be located in a second, different region in the object.

While FIG. 1 illustrates various actions occurring in serial, it is to be appreciated that various actions illustrated in FIG. 1 could occur substantially in parallel. By way of illustration, a first process could perform a calibration while a second process could establish the parameters. Looking ahead to FIG. 2, a third process could control a transmitter based on the transmission parameters. While three processes are described, it is to be appreciated that a greater and/or lesser number of processes could be employed and that lightweight processes, regular processes, threads, and other approaches could be employed.

Figure 2:
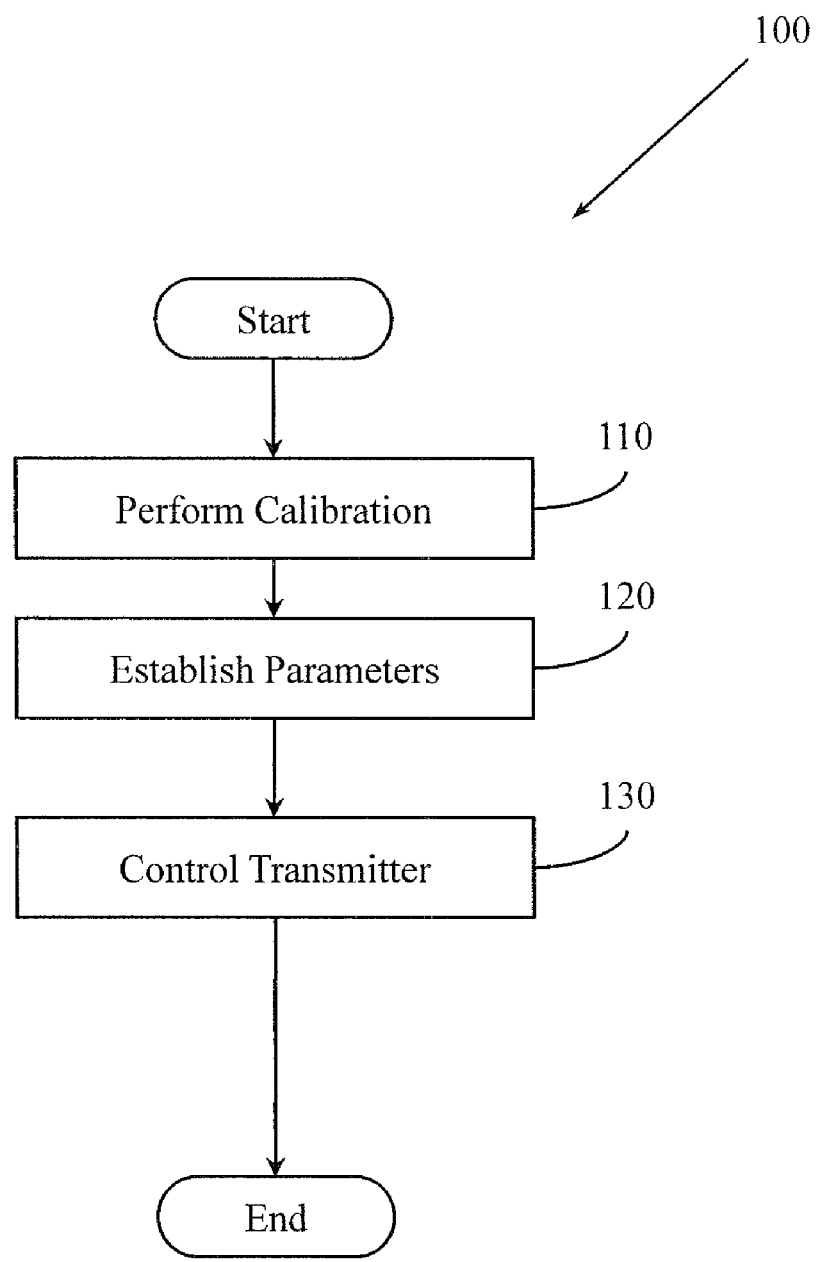
FIG. 2 illustrates an example method associated with calibrating and controlling a multi-channel transmission coil with individually programmable channels.

FIG. 2 illustrates another embodiment of method 100. This embodiment includes, at 130, controlling the multi-channel transmitter to produce the set of excitation pulses for the transmission channels according to the set of transmission parameters. In this embodiment, the resulting NMR signal will have NMR signal associated with the first NMR resonance and NMR signal associated with the second NMR resonance. However, the NMR signal associated with the first NMR resonance and the NMR signal associated with the second NMR resonance will appear in a desired ratio. This facilitates, for example, producing improved fat saturation images, producing improved water saturation images, producing improved regional excitation images, and so on.

Figure 3:
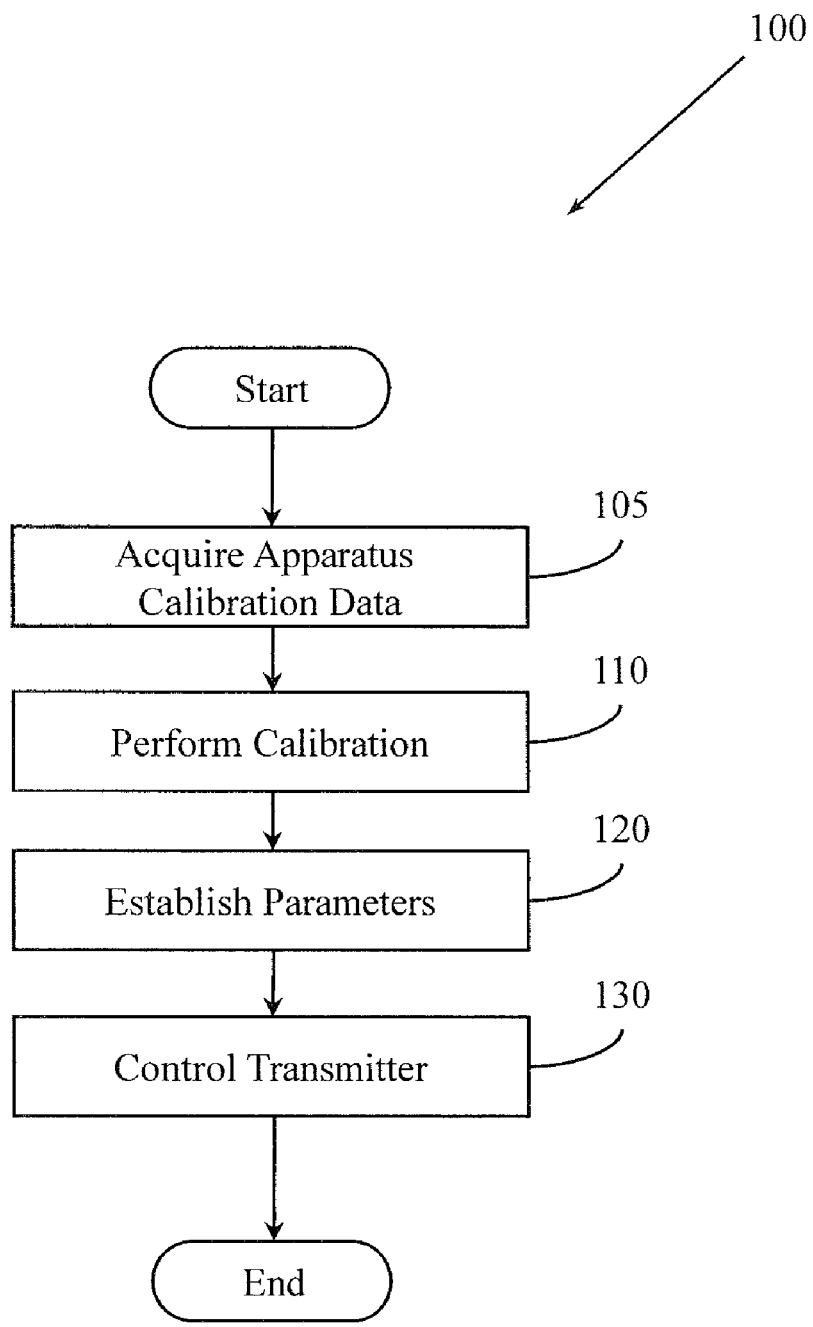
FIG. 3 illustrates an example method associated with calibrating and controlling a multi-channel transmission coil with individually programmable channels.

FIG. 3 illustrates another embodiment of method 100. This embodiment also includes, at 105, acquiring calibration data associated with the MRI apparatus. In this embodiment, with the calibration data available, performing the calibration at 110 may include determining the amplitude and frequency in parallel as a function of the calibration data and the resulting NMR signal.

In one example, spatial information may be received in parallel from an array of receivers that receive the resulting NMR signal after application of the members of the set of excitation pulses. Signal received at different members of the array of receivers may be combined. Different members of the array of receivers have spatial uniqueness different from the individual transmission channels in the multi-channel transmitter. The spatial uniqueness facilitates weighting a resulting frequency estimate towards a location in the object. Additionally, the weighting facilitates producing a B0 map or coil sensitivities without measuring the B0 field or the coil sensitivities. With this information available, performing the calibration at 110 may be performed in parallel and may be a function of a spatial sensitivity profile of a transmission channel and the spatial information.

Figure 4:
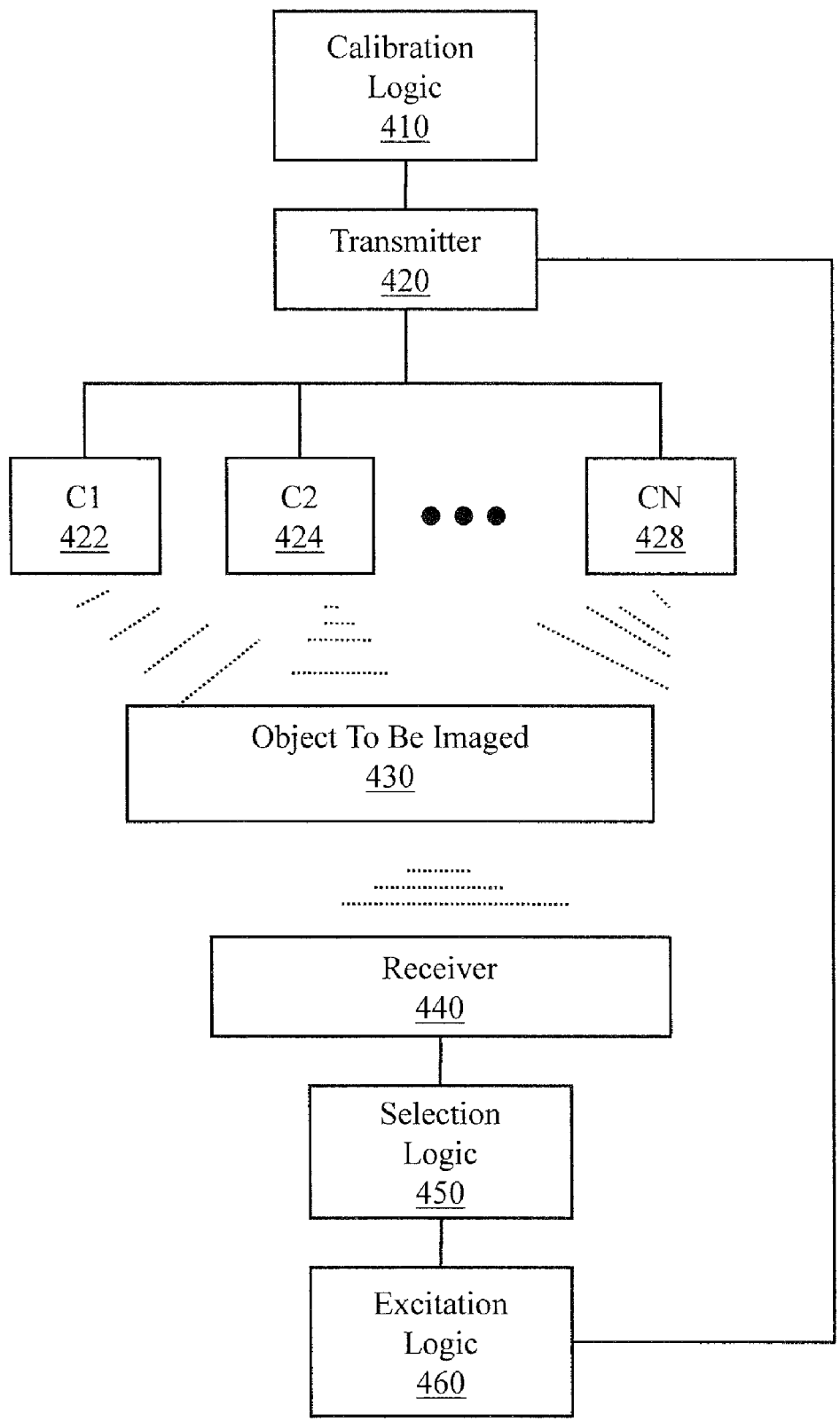
FIG. 4 illustrates an example apparatus associated with calibrating and controlling a multi-channel transmission coil with individually programmable channels.

FIG. 4 illustrates an apparatus associated with calibrating individual transmission channels on a multi-channel MRI transmitter 420. The multi-channel transmitter 420 has multiple individually controllable transmission channels. The channels may be associated with individual transmission coils (e.g., coil C1 422, and coil C2 424 through coil CN 428).

The apparatus includes a calibration logic 410. Calibration logic 410 is configured to control the transmitter 420 to apply one or more test pulses to an object to be imaged 430. The individually controllable transmission channels may be controllable with respect to transmission frequency, transmission bandwidth, transmission amplitude, and so on. The calibration logic 410 is configured to apply the test pulses through one channel of the two or more individually controllable transmission channels at a time. One skilled in the art will appreciate that calibration logic 410 may also be configured to apply test pulses through combinations of channels.

The object to be imaged 430 may produce a first signal associated with a first NMR resonance and a second signal associated with a second NMR resonance. The transmitter 420 is to be configured so that first signal is to be suppressed by a set of excitation pulses applied through the transmitter 420 and so that the second signal is not to be suppressed by the set of excitation pulses applied through the transmitter 420. For example, it may be desired to suppress signal associated with fat spins while not suppressing signal associated with water spins. While suppression associated with chemical shift selective imaging is described, one skilled in the art will appreciate that suppression or excitation associated with other magnetic resonance imaging approaches may be achieved.

The apparatus also includes a selection logic 450. Selection logic 450 is configured to select a center frequency, a bandwidth, and an amplitude for the channel in response to a test NMR signal received from the object to be imaged 430 after the test pulse is applied. The center frequency, bandwidth, and amplitude for the channel are to be selected based, at least in part, on the test frequency, the test bandwidth, and the test amplitude. The test NMR signal will have NMR signal associated with the first signal and the second signal. In one example, the selection logic 450 is configured to select the center frequency, bandwidth, and amplitude for the channel based, at least in part, on a level of NMR signal associated with the second signal that can be tolerated to preserve an image quality that exceeds a desired threshold.

The apparatus also includes an excitation logic 460. Excitation logic 460 is configured to control the transmitter 420 to apply the set of excitation pulses through the transmission channels to the object to be imaged 430. A member of the set of excitation pulses is designed as a function of the center frequency, the bandwidth, and the amplitude for the channel as determined by the selection logic 450 so that the NMR signal received from the object to be imaged 430 in response to the set of excitation pulses includes NMR signal associated with the first signal and NMR signal associated with the second signal in a desired ratio.

The apparatus facilitates improved chemical shift selective imaging, improved regional imaging, and so on. Therefore, in one example, the test pulses are saturation pulses. In this example, the test NMR signal is evaluated with respect to saturation uniformity based, at least in part, on a ratio of the first signal and the second signal. In this chemical shift example, the first signal may be associated with fat spins and the second signal may be associated with water spins, or vice versa. In a regional imaging example, the first signal may be associated with spins located in a first region and the second signal may be associated with spins located in a second region.

The calibration logic 410 may send out different types of test pulses. For example, the calibration logic 410 may produce test pulses associated with free induction decay (FID) calibration, echo calibration, and so on. One skilled in the art will appreciate that other types of test pulses may be employed.

In one example, a spatial sensitivity profile of the channel may describe spatial amplitude variations associated with the channel. Therefore, test pulses may be configured to identify a desired weighting of the spatial amplitude variations associated with the channel.

In one example, the calibration may proceed through iterations, where a subsequent iteration relies on information gathered in a previous iteration(s). In this embodiment, the selection logic 450 may be configured to control the calibration logic 410 to apply test pulses that are configured to facilitate deriving the frequency, bandwidth, and amplitude for the excitation pulses as a function of a least-squares fitting process, an iterative optimization process, and so on.

In general, the calibration logic 410 is configured to first solve for frequency and then to solve for amplitude. The amplitude may be solved for as a function of a solved for frequency. However, in one embodiment, the calibration logic 410 is configured to solve for frequency and amplitude in parallel. Frequency and amplitude may be solved for in parallel when pre-existing MRI apparatus calibration data is available. This pre-existing calibration data may include, for example, coil sensitivity profiles, a B0 map, and so on. When solving for frequency and amplitude in parallel, the calibration logic 410 may employ a successive approximation technique, an iterative approximation technique, and so on.

Figure 5:
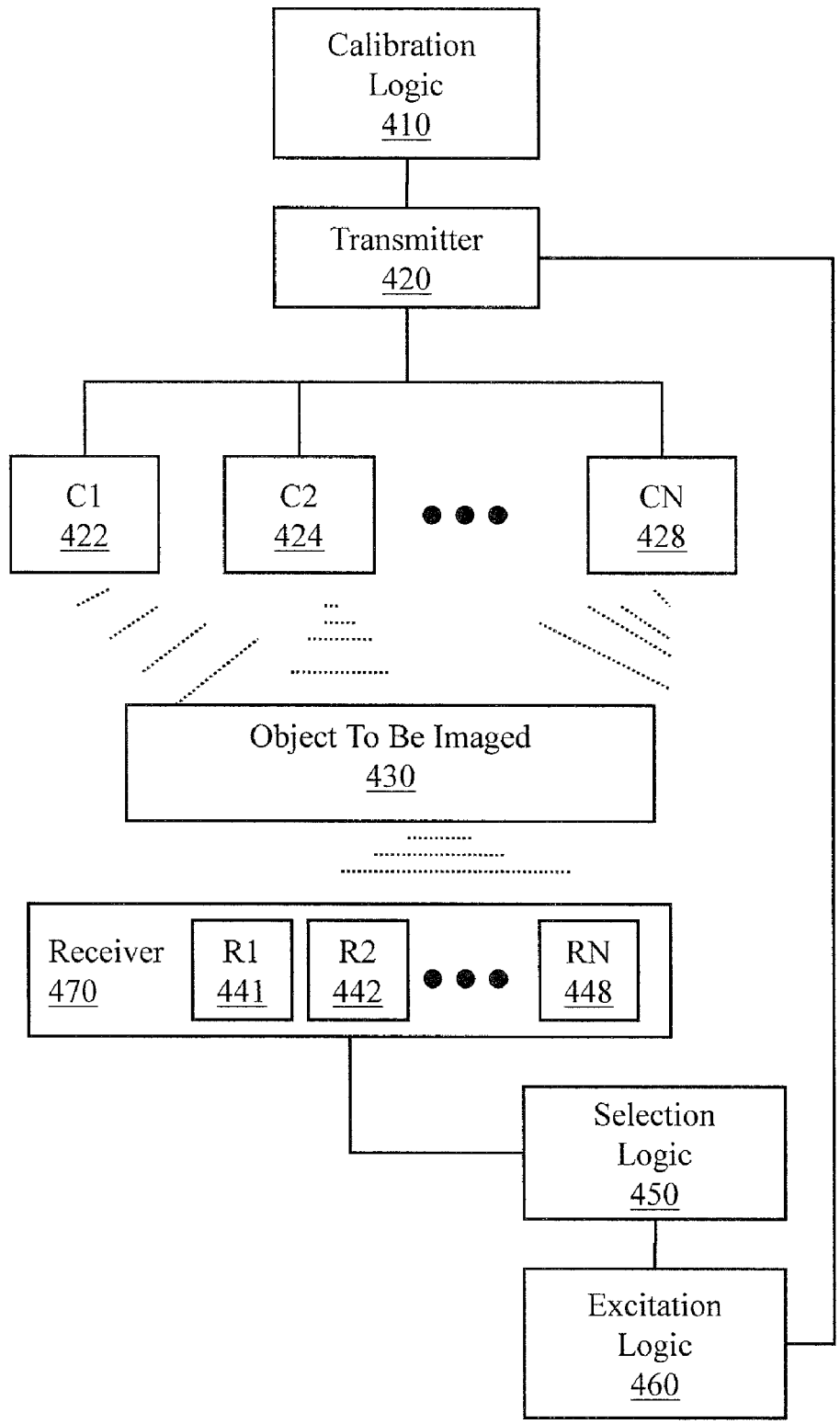
FIG. 5 illustrates an example apparatus associated with calibrating and controlling a multi-channel transmission coil with individually programmable channels.

FIG. 5 illustrates another embodiment of the apparatus. In this embodiment, the selection logic 450 is configured to receive spatial information received from a parallel receiver 470. The parallel receiver 470 may include individual receive coils (e.g., receive coil R1 441, and receive coil R2 442 through receive coil RN 448). The parallel receiver 470 receives the test NMR signal from the object to be imaged 430 after application of the test pulse. In this embodiment, the selection logic 450 is configured to select the center frequency, the bandwidth, and the amplitude for the channel in parallel based, at least in part, on the spatial sensitivity profile of the channel and the spatial information.

Figure 6:
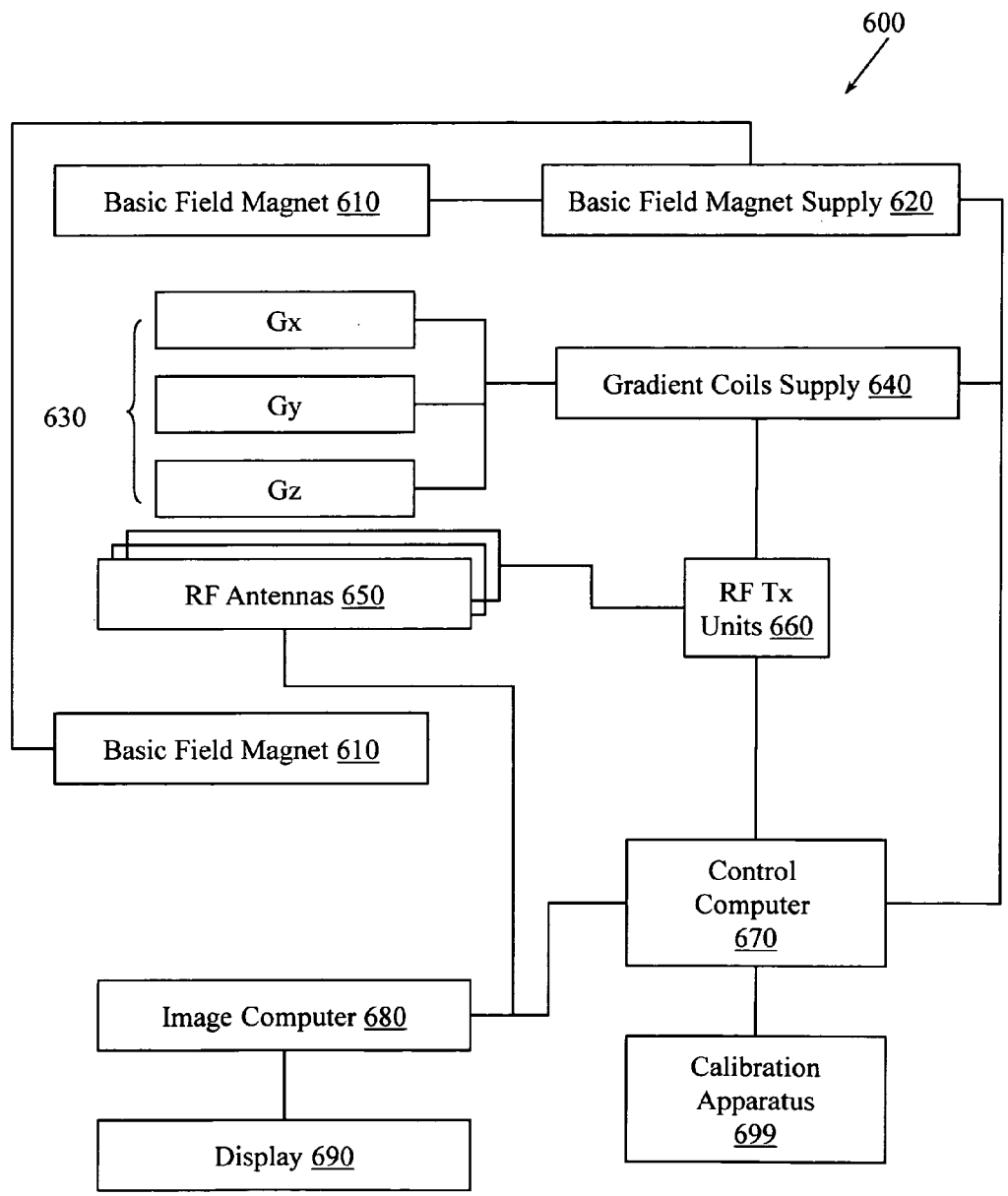
FIG. 6 illustrates an MRI apparatus configured with an apparatus for calibrating and controlling a multi-channel transmission coil with individually programmable channels.

FIG. 6 illustrates an example MRI apparatus 600 configured with a calibration apparatus 699 configured to facilitate improving excitation uniformity. The calibration apparatus 699 may be configured with elements of example apparatus described herein and/or may perform example methods described herein. The calibration apparatus 699 may provide means (e.g., hardware, software, firmware) for calibrating individual transmission channels in an MRI multi-channel transmitter with respect to transmission amplitude, transmission frequency, and transmission bandwidth. The calibration apparatus 699 may also provide means (e.g., hardware, software, firmware) for magnetic resonance imaging an object using a combination of pulses emitted by the transmission channels. In one embodiment, a nuclear magnetic resonance signal emitted by the object in response to the combination of pulses has a first signal component associated with a first NMR and a second signal component associated with a second NMR. The calibration apparatus is configured to calibrate the multiple transmission channels so that the first signal component and the second signal component satisfy a desired ratio. For example, signal associated with fat spins should be less than 1% of the total signal while signal associated with water spins should be at least 99% of the total signal.

The apparatus 600 includes a basic field magnet(s) 610 and a basic field magnet supply 620. Ideally, the basic field magnets 610 would produce a uniform B0 field. However, in practice, the B0 field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to an RF antenna 650.

The gradient coils supply 640 and the RF transmission units 660 may be controlled, at least in part, by a control computer 670. In one example, the control computer 670 may be programmed to control an IMRI device as described herein. The magnetic resonance signals received from the RF antennas 650 can be employed to generate an image and thus may be subject to a transformation process like a two dimensional FFT that generates pixilated image data. The transformation can be performed by an image computer 680 or other similar processing device. The image data may then be shown on a display 690. While FIG. 6 illustrates an example MRI apparatus 600 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium containing instructions stored therein for causing a computer processor to perform a method, the method comprising:
   performing a calibration to determine a set of transmission parameters for a set of excitation pulses for two or more transmission channels available on a multi-channel transmitter associated with a magnetic resonance imaging (MRI) apparatus, where the set of excitation pulses are configured to produce a resulting nuclear magnetic resonance (NMR) signal from an object exposed to the set of excitation pulses, where the resulting NMR signal comprises NMR signal associated with a first NMR resonance associated with the object and NMR signal associated with a second NMR resonance associated with the object; and
   establishing the transmission parameters in one or more of, the MRI apparatus, and an MRI simulation.

2. The non-transitory computer-readable medium of claim 1, the method comprising:
   controlling the multi-channel transmitter to produce the set of excitation pulses for the two or more transmission channels according to the set of transmission parameters, where the resulting NMR signal comprises, in a desired ratio, NMR signal associated with the first NMR resonance and NMR signal associated with the second NMR resonance.

3. The non-transitory computer-readable medium of claim 1, where the set of transmission parameters includes one or more of, frequency, bandwidth, and amplitude.

4. The non-transitory computer-readable medium of claim 2, where performing the calibration to determine the set of transmission parameters includes controlling the multi-channel transmitter to apply radio frequency (RF) energy to the object according to one or more of, a free induction decay (FID) calibration, a stimulated echo calibration, and a spin echo calibration.

5. The non-transitory computer-readable medium of claim 1, where the first NMR resonance is associated with a first set of spins in the object and where the second NMR resonance is associated with a second set of spins in the object.

6. The non-transitory computer-readable medium of claim 5, the first set of spins being water spins and the second set of spins being fat spins.

7. The non-transitory computer-readable medium of claim 5, the first set of spins being located in a first region in the object and the second set of spins being located in a second, different region in the object.

8. The non-transitory computer-readable medium of claim 1, the method comprising acquiring calibration data associated with the MRI apparatus and where performing the calibration to determine the set of transmission parameters comprises determining the amplitude and frequency in parallel as a function of the calibration data and the resulting NMR signal.

9. The non-transitory computer-readable medium of claim 2, the method comprising receiving spatial information in parallel from an array of receivers that receive the resulting NMR signal after application of the members of the set of excitation pulses, combining signal received at different members of the array of receivers, where different members of the array of receivers have spatial uniqueness different from the individual transmission channels in the multi-channel transmitter, where the spatial uniqueness facilitates weighting a resulting frequency estimate towards a location in the object, and where the weighting facilitates producing one or more of, a main magnetic field B0 map, and coil sensitivities, without measuring the B0 field or the coil sensitivities, and where performing the calibration to determine the set of transmission parameters is performed in parallel based, at least in part, on a spatial sensitivity profile of a transmission channel and the spatial information.

10. An apparatus, comprising:
a calibration logic configured to control a transmitter having two or more individually controllable transmission channels to apply one or more test pulses having a test frequency, a test bandwidth, and a test amplitude through a channel of the two or more individually controllable transmission channels to an object, where the object may produce a first signal associated with a first NMR resonance and a second signal associated with a second NMR resonance, where the first signal is to be suppressed by a set of excitation pulses applied through the transmitter, and where the second signal is not to be suppressed by the set of excitation pulses applied through the transmitter;
a selection logic configured to select, in response to a test NMR signal received from the object after application of the test pulse, a center frequency, a bandwidth, and an amplitude for the channel based, at least in part, on the test frequency, the test bandwidth, and the test amplitude, where the test NMR signal includes NMR signal associated with the first signal and the second signal; and
an excitation logic configured to control the transmitter to apply the set of excitation pulses through the two or more transmission channels to the object, where a member of the set of excitation pulses is designed as a function of the center frequency, the bandwidth, and the amplitude for the channel, and where NMR signal received from the object to be imaged in response to the set of excitation pulses comprises NMR signal associated with the first signal and NMR signal associated with the second signal in a desired ratio.

11. The apparatus of claim 10, where the one or more test pulses are saturation pulses.

12. The apparatus of claim 11, where the test NMR signal is evaluated with respect to uniformity based, at least in part, on a ratio of the first signal and the second signal.

13. The apparatus of claim 11, the first signal being associated with fat spins and the second signal being associated with water spins.

14. The apparatus of claim 10, the first signal being associated with spins located in a first region and the second signal being associated with spins in a second region.

15. The apparatus of claim 10, where the one or more test pulses are associated with one or more of, a free induction decay (FID) calibration, and an echo calibration.

16. The apparatus of claim 10, where the spatial sensitivity profile of the channel describes spatial amplitude variations associated with the channel.

17. The apparatus of claim 16, where the one or more test pulses are configured to identify a desired weighting of the spatial amplitude variations associated with the channel.

18. The apparatus of claim 10, where the selection logic is configured to control the calibration logic to apply a plurality of test pulses, where the plurality of test pulses are configured to facilitate deriving the frequency, bandwidth, and amplitude for the excitation pulses, where members of the plurality of test pulses are selected as a function of one or more of, a least-squares fitting process, and an iterative optimization process.

19. The apparatus of claim 10, where the selection logic is configured to receive spatial information received from a parallel receiver that receives the test NMR signal from the object after application of the test pulse, and where the selection logic is configured to select the center frequency, the bandwidth, and the amplitude for the channel in parallel based, at least in part, on the spatial sensitivity profile of the channel and the spatial information.

20. The apparatus of claim 10, where the calibration logic is configured to first solve for frequency and then to solve for amplitude, where amplitude is solved for based, at least in part, on solved for frequency.

21. The apparatus of claim 10, where the calibration logic is configured to solve for frequency and amplitude in parallel based, at least in part, on pre-existing MRI apparatus calibration data.

22. The apparatus of claim 21, where the pre-existing calibration data comprises one or more of, coil sensitivity profiles, and a map of the main magnetic field B0.

23. The apparatus of claim 22, where the calibration logic is configured to solve for frequency and amplitude in parallel using one or more of, a successive approximation technique, or an iterative approximation technique.

24. The apparatus of claim 10, where the selection logic is configured to select the center frequency, bandwidth, and amplitude for the channel based, at least in part, on a level of NMR signal associated with the second signal that can be tolerated to preserve an image quality that exceeds a desired threshold.

25. A system, comprising:
means for calibrating individual transmission channels in an MRI multi-channel transmitter with respect to transmission amplitude, transmission frequency, and transmission bandwidth; and
means for magnetic resonance imaging an object using a combination of pulses emitted by the transmission channels, where a nuclear magnetic resonance signal emitted by the object in response to the combination of pulses comprises a first signal component associated with a first NMR and a second signal component associated with a second NMR, where the first signal component and the second signal component satisfy a desired ratio.

* * * * *